US009711382B2

(12) United States Patent
Ranish et al.

(10) Patent No.: US 9,711,382 B2
(45) Date of Patent: *Jul. 18, 2017

(54) DOME COOLING USING COMPLIANT MATERIAL

(71) Applicant: Applied Materials, Inc., Santa Clara, CA (US)

(72) Inventors: Joseph M. Ranish, San Jose, CA (US); Paul Brillhart, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 550 days.

This patent is subject to a terminal disclaimer.

(21) Appl. No.: 14/254,568

(22) Filed: Apr. 16, 2014

(65) Prior Publication Data

US 2014/0334806 A1    Nov. 13, 2014

Related U.S. Application Data

(60) Provisional application No. 61/821,804, filed on May 10, 2013.

(51) Int. Cl.
*A21B 2/00* (2006.01)
*H01L 21/67* (2006.01)

(52) U.S. Cl.
CPC .............................. *H01L 21/67115* (2013.01)

(58) Field of Classification Search
None
See application file for complete search history.

(56) References Cited

U.S. PATENT DOCUMENTS 4,489,234 A * 12/1984 Harnden, Jr. ............. B32B 3/12
219/460.1
5,487,127 A * 1/1996 Gronet .................. C23C 16/481
118/50.1

(Continued)

FOREIGN PATENT DOCUMENTS

JP       2001-176865 A    6/2001
KR    10-2008-0030713    4/2008
KR    10-2008-0055608    6/2008

OTHER PUBLICATIONS

International Search Report and Written Opinion dated Aug. 14, 2014 for Application No. PCT/US2014/034218.

(Continued)

*Primary Examiner* — Thor Campbell
(74) *Attorney, Agent, or Firm* — Patterson + Sheridan, LLP

(57) ABSTRACT

Embodiments described herein generally relate to apparatus for processing substrates. The apparatus generally include a process chamber including a lamp housing containing lamps positioned adjacent to an optically transparent window. Lamps within the lamp housing provide radiant energy to a substrate positioned on the substrate support. Temperature control of the optically transparent window is facilitated using cooling channels within the lamp housing. The lamp housing is thermally coupled to the optically transparent window using compliant conductors. The compliant conductors maintain a uniform conduction length irrespective of machining tolerances of the optically transparent window and the lamp housing. The uniform conduction length promotes accurate temperature control. Because the length of the compliant conductors is uniform irrespective of machining tolerances of chamber components, the conduction length is the same for different process chambers. Thus, (Continued)

temperature control amongst multiple process chambers is uniform, reducing chamber-to-chamber variation.

20 Claims, 5 Drawing Sheets

(56) References Cited

U.S. PATENT DOCUMENTS

| | | | |
|---|---|---|---|
| 5,937,142 A * | 8/1999 | Moslehi | C23C 16/481 118/725 |
| 6,016,383 A * | 1/2000 | Gronet | C23C 16/481 219/405 |
| 6,021,844 A | 2/2000 | Batchelder | |
| 6,167,195 A * | 12/2000 | Moslehi | C23C 16/481 118/724 |
| 6,284,051 B1 | 9/2001 | Fidelman | |
| 6,367,410 B1 | 4/2002 | Leahey et al. | |
| 6,434,327 B1 * | 8/2002 | Gronet | C23C 16/481 219/405 |
| 6,856,092 B2 | 2/2005 | Pothoven et al. | |
| 7,429,818 B2 | 9/2008 | Chang et al. | |
| 7,978,964 B2 * | 7/2011 | Ranish | H01J 65/00 392/407 |
| 8,582,962 B2 * | 11/2013 | Ranish | H01J 65/00 392/407 |
| 2004/0045575 A1 | 3/2004 | Kinoshita et al. | |
| 2007/0252500 A1 | 11/2007 | Ranish et al. | |
| 2008/0170842 A1 | 7/2008 | Hunter et al. | |
| 2011/0263138 A1 * | 10/2011 | Ranish | H01J 65/00 438/795 |
| 2011/0299282 A1 * | 12/2011 | Carlson | H01L 21/67115 362/253 |
| 2014/0254150 A1 * | 9/2014 | Ranish | H01L 21/67115 362/235 |
| 2016/0111306 A1 * | 4/2016 | Ranish | H05B 3/0047 392/416 |

OTHER PUBLICATIONS http://www.indium.com/thermal-interface-materials/heat-spring/.
International Search Report and Written Opinion dated Jul. 28, 2015 for Application No. PCT/US2015/029049.

* cited by examiner

DOME COOLING USING COMPLIANT MATERIAL

CROSS-REFERENCE TO RELATED APPLICATIONS

This application claims benefit of U.S. Provisional Patent Application Ser. No. 62/821,804, filed May 10, 2013, which is herein incorporated by reference.

BACKGROUND OF THE DISCLOSURE

Field of the Disclosure

Embodiments of the present disclosure generally relate to apparatus for heating substrates, such as semiconductor substrates.

Description of the Related Art

Semiconductor substrates are processed for a wide variety of applications, including the fabrication of integrated devices and microdevices. One method of processing substrates includes depositing a material, for example, an epitaxial material, on a substrate surface. Deposited film quality is dependent upon several factors, including process conditions such as temperature. As transistor size decreases, temperature control becomes more important in forming high quality films. Additionally or alternatively, deposited materials may be thermally treated, for example annealed, after deposition on a substrate. Consistent temperature control during deposition or thermal treatment results in process-to-process repeatability.

However, each processing chamber utilized to process substrates has slight variations from other chambers, particularly due to machining tolerances of the individual components of each chamber. Thus, each individual chamber has different characteristics during a thermal process, for example, different cooling rates or chamber hot spots, resulting in substrates processed in different chambers having different properties (e.g., chamber-to-chamber variation). The variation between substrates processed on different chambers is amplified as transistor device decreases. Thus, substrates processed on a first chamber will have different properties than substrates processed on other chambers, even though the same processing recipe was used on all the chambers.

Therefore, there is a need for an apparatus that reduces chamber-to-chamber variation of processed substrates.

SUMMARY OF THE DISCLOSURE

Embodiments described herein generally relate to apparatus for processing substrates. The apparatus generally include a process chamber including a lamp housing containing lamps positioned adjacent to an optically transparent window. Lamps within the lamp housing provide radiant energy to a substrate positioned on the substrate support. Temperature control of the optically transparent window is facilitated using cooling channels within the lamp housing. The lamp housing is thermally coupled to the optically transparent window using compliant conductors. The compliant conductors maintain a uniform conduction length irrespective of machining tolerances of the optically transparent window and the lamp housing. The uniform conduction length promotes accurate temperature control. Because the length of the compliant conductors is uniform irrespective of machining tolerances of chamber components, the conduction length is the same for different process chambers. Thus, temperature control amongst multiple process chambers is uniform, reducing chamber-to-chamber variation.

In one embodiment, a process chamber comprises a chamber body including an optically transparent window and a lamp housing disposed adjacent to the optically transparent window. The optically transparent window and the lamp housing having a gap therebetween and one or more cooling channels are disposed within the lamp housing. A plurality of compliant conductors are disposed within the gap between the lamp housing and transparent window. The compliant conductors are in contact with the lamp housing and transparent window.

In another embodiment, a process chamber comprises a chamber body including an optically transparent window and a lamp housing disposed adjacent to the optically transparent window. The optically transparent window and the lamp housing having a gap therebetween. One or more cooling channels are disposed within the lamp housing. The process chamber also includes a plurality of compliant conductors disposed within the gap between the lamp housing and transparent window and in contact with the lamp housing and transparent window. The compliant conductors may include mesh or wool.

In another embodiment, a process chamber comprises a chamber body including an optically transparent window, and a lamp housing disposed adjacent to the optically transparent window. The optically transparent window and the lamp housing include a gap therebetween. One or more cooling channels are disposed within the lamp housing. The process chamber also includes a plurality of compliant conductors disposed within the gap between the lamp housing and transparent window and in contact with the lamp housing and transparent window. The compliant conductors include a coating on an end thereof in contact with the transparent window.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to apparatus for processing substrates. The apparatus generally include a process chamber including a lamp housing containing lamps positioned adjacent to an optically transparent window. Lamps within the lamp housing provide radiant energy to a substrate positioned on the substrate support. Temperature control of the optically transparent window is facilitated using cooling channels within the lamp housing. The lamp housing is thermally coupled to the optically transparent window using compliant conductors. The compliant conductors maintain a uniform conduction length irrespective of machining tolerances of the optically transparent window and the lamp housing. The uniform conduction length promotes accurate temperature control. Because the length of the compliant conductors is uniform irrespective of machining tolerances of chamber components, the conduction length is the same for different process chambers. Thus, temperature control amongst multiple process chambers is uniform, reducing chamber-to-chamber variation.

Figure 1:
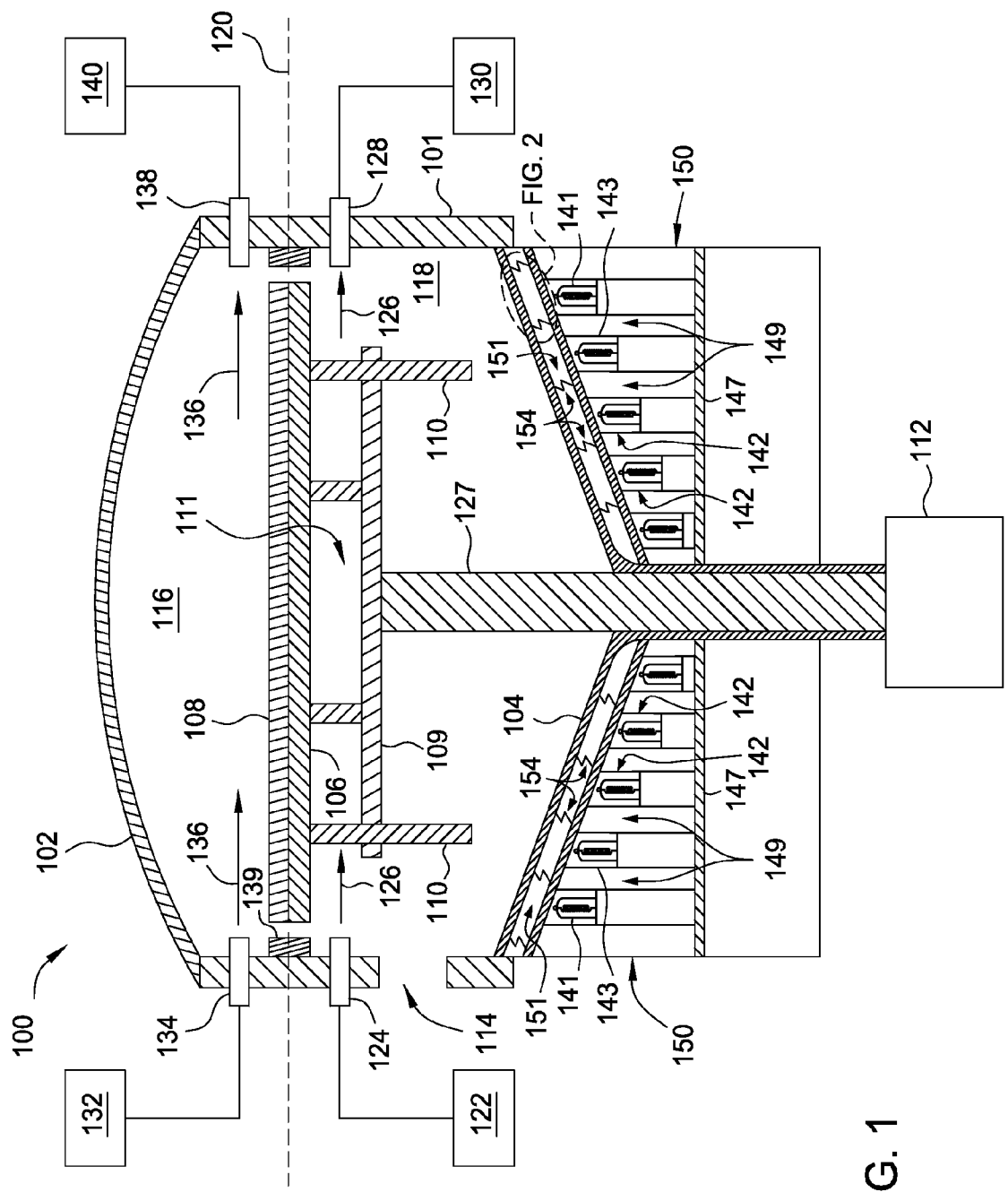
FIG. 1 is a schematic sectional view of a process chamber according to one embodiment of the disclosure.

FIG. 1 is a schematic sectional view of a process chamber 100 according to one embodiment of the disclosure. The process chamber 100 may be used to process one or more substrates, including the deposition of a material on an upper surface of a substrate. The process chamber 100 includes a chamber body 101, an upper window 102, such as a dome, formed from a material such as a stainless steel, aluminum, ceramics (e.g., quartz), or coated metals or ceramics. The process chamber 100 also includes a lower window 104, such as a dome, formed from an optically transparent material such as quartz. The lower window 104 is coupled to, or is an integral part of, the chamber body 101. A substrate support 106 adapted to support a substrate 108 thereon is disposed within the process chamber 100 between the upper window 102 and the lower window 104. The substrate support 106 is coupled to a support plate 109 and forms a gap 111 therebetween. The support plate 109 is formed from an optically transparent material, such as quartz, to allow radiant energy from lamps 142 to impinge upon and heat the substrate support 106 to a desired processing temperature. The substrate support 106 is formed from silicon carbide or graphite coated with silicon carbide to absorb radiant energy from the lamps 142 and transfer the radiant energy to the substrate 108.

The substrate support 106 is shown in an elevated processing position, but may be vertically actuated by an actuator 112 to a loading position below the processing position to allow lift pins 110 to contact the lower window 104 and raise the substrate 108 from the substrate support 106. A robot (not shown) may then enter the process chamber 100 to engage and remove the substrate 108 therefrom through an opening 114, such as a slit valve. The substrate support 106 is also adapted to be rotated during processing by the actuator 112 to facilitate uniform processing of the substrate 108.

The substrate support 106, while located in the processing position, divides the internal volume of the process chamber 100 into a process gas region 116 and a purge gas region 118. The process gas region 116 includes the internal chamber volume located between the upper window 102 and a plane 120 of the substrate support 106 while the substrate support 106 is located in the processing position. The purge gas region 118 includes the internal chamber volume located between the lower window 104 and the plane 120.

Purge gas supplied from a purge gas source 122 is introduced to the purge gas region 118 through a purge gas inlet 124 formed within a sidewall of the chamber body 101. The purge gas flows laterally along flow path 126 across the back surface of the support 106, and is exhausted from the purge gas region 118 through a purge gas outlet 128 located on the opposite side of the process chamber 100 as the purge gas inlet 124. An exhaust pump 130, coupled to the purge gas outlet 128, facilitates removal of the purge gas from the purge gas region 118.

Process gas supplied from a process gas supply source 132 is introduced into the process gas region 116 through a process gas inlet 134 formed in a sidewall of the chamber body 101. The process gas flows laterally across the upper surface of the substrate 108 along flow path 136. The process gas exits the process gas region 116 through a process gas outlet 138 located on the opposite side of the process chamber 100 as the process gas inlet 134. Removal of the process gas through the process gas outlet 138 is facilitated by a vacuum pump 140 coupled thereto.

Multiple lamps 142 are disposed adjacent to and beneath the lower window 104 to heat the substrate 108 as the process gas passes thereover to facilitate the deposition of a material onto the upper surface of the substrate 108. The lamps 142 are positioned in a lamp housing 150, formed from, for example, copper, aluminum, or stainless steel. The lamps include bulbs 141 surrounded by an optional reflector 143. Each lamp 142 is coupled to a power distribution board 147 through which power is supplied to each lamp 142. The lamps 142 are arranged in annular groups of increasing radius around a shaft 127 of the substrate support 106. The shaft 127 is formed form quartz or another optically transparent material.

An upper surface of the lamp housing 150 is positioned in a spaced apart orientation from the lower window 104 to form a gap 151 therebetween. In one example, the gap 151 may be about 0.5 millimeters to about 10 millimeters, or more. In one example, the gap 151 is about 6 millimeters. Thermal energy is transferred from the lower window 104 to the lamp housing 150 via compliant conductors 154 positioned within the gap 151. While ten compliant conductors 154 are shown, it is contemplated that more than 10 compliant conductors 154 may be utilized. The compliant conductors 154 facilitate heat removal from the lower window 104, which further increases the rate of cooling of the substrate 108 by reducing the radiation, conduction, and convection of heat from the lower window 104 to the substrate 108. Cooling channels 149 remove heat from the lamp housing 150 to facilitate cooling of the lamp housing 150 and the lower window 104.

The lamps 142 are adapted to the heat the substrate to a predetermined temperature to facilitate thermal decomposition of the process gas onto the surface of the substrate 108. In one example, the material deposited onto the substrate may be a group III, group IV, and/or group V material, or may be a material including a group III, group IV, and/or group V dopant. For example, the deposited material may include gallium arsenide, gallium nitride, or aluminum gallium nitride. The lamps may be adapted to heat the substrate to a temperature within a range of about 300 degrees Celsius to about 1200 degrees Celsius, such as about 300 degrees Celsius to about 950 degrees Celsius.

Although FIG. 1 illustrates one embodiment of a process chamber, additional embodiments are also contemplated. For example, in another embodiment, it is contemplated that the substrate support 106 may be formed from an optically transparent material, such as quartz, to allow for direct heating of the substrate 108. In yet another embodiment, it is contemplated that an optional circular shield 139 may be disposed around the substrate support 106 and coupled to a sidewall of the chamber body 101. In another embodiment, the process gas supply source 132 may be adapted to supply multiple types of process gases, for example, a group III precursor gas and a group V precursor gas. The multiple process gases may be introduced into the chamber through the same process gas inlet 134, or through different process gas inlets 134. Additionally, it is also contemplated that the size, width, and/or number of gas inlets 124, 134, or gas outlets 128, 138 may be adjusted to further facilitate a uniform deposition of material on the substrate 108.

In another embodiment, the substrate support 106 may be an annular ring or edge ring having a central opening therethrough, and may be adapted to support the perimeter of the substrate 108. In such an embodiment, the substrate support 106 may be formed from silicon carbide, silicon-carbide-coated graphite, or glassy-carbon-coated graphite. In another embodiment, the substrate support may be a three or more pin support that provides minimal conductive cooling.

Figure 2:
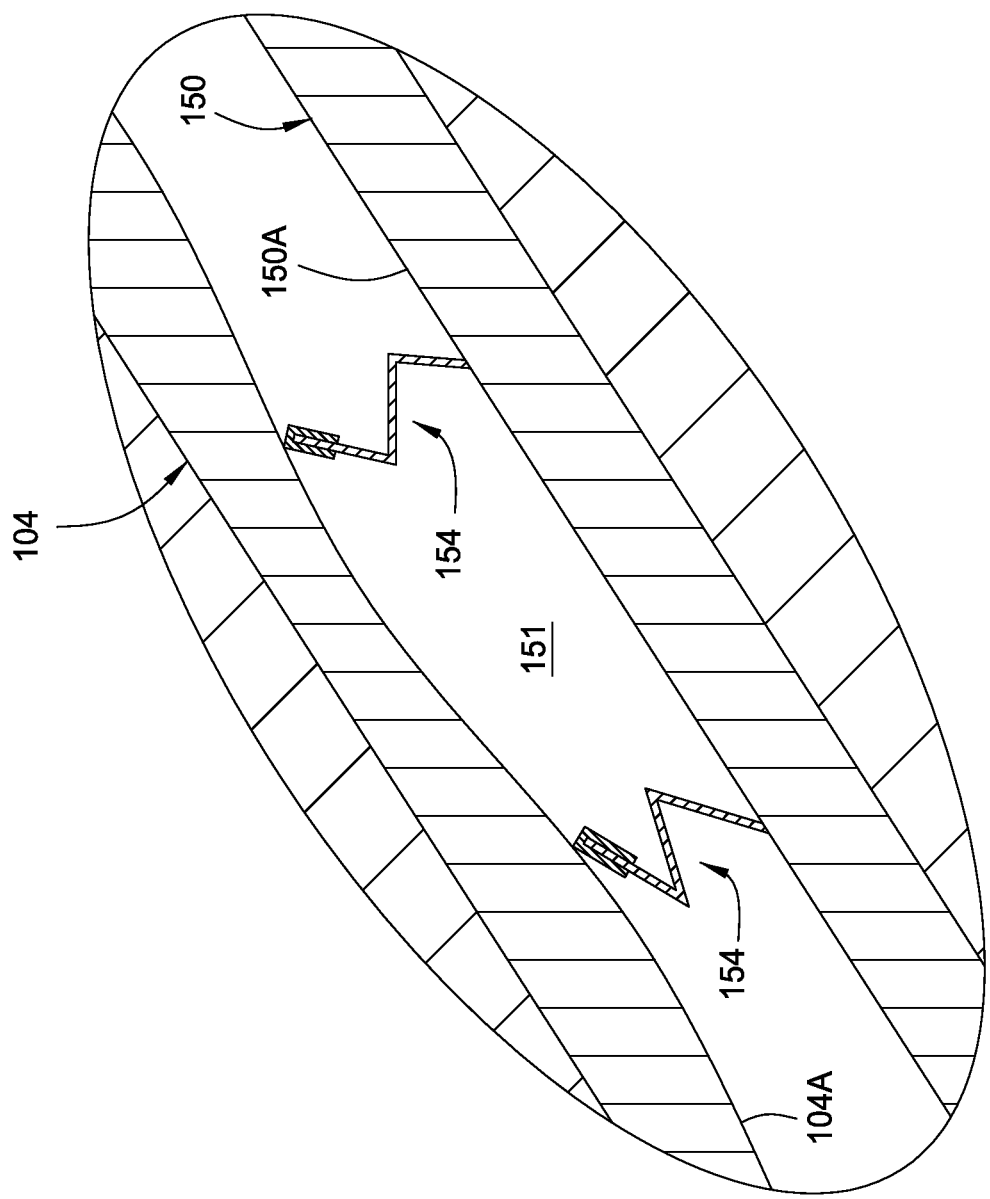
FIG. 2 is an enlarged partial view of FIG. 1 illustrating compliant conductors.

FIG. 2 is an enlarged partial view of FIG. 1 illustrating the compliant conductors 154. In the embodiment shown in FIG. 2, the compliant conductors 154 have a "zig-zag" or "serpentine" shape. The compliant conductors 154 are positioned between and in contact with a lower surface 104a of the lower window 104 and an upper surface 150a of the lamp housing 150. The lamp housing 150 is formed from a metal, such as stainless steel or copper, and can be formed to relatively exact tolerances using modern machining techniques, such as computer numerical control (CNC) machining. Thus, the upper surface 150a is relatively planar. In contrast, the lower surface 104a of the lower window 104 is not capable of be produced to as exact of tolerances as the lamp housing 150 due to the difficulties of machining the material from which the lower window 104 is constructed. In one example, the lower surface 104a may have as much as 1 millimeter difference in planarity, resulting in the height of the gap 151 varying along the length of the lower window 104. The difference in the height of the gap 151 can affect the heat transfer between the lower window 104 and the lamp housing 150 at different locations, primarily due to the difference in conduction length path across the gap 151.

To facilitate more uniform heat transfer, the compliant conductors 154 are positioned between the lower window 104 and the lamp housing 150. The compliant conductors are in physical contact with the lower surface 104a of the lower window 104 and the upper surface 150a of the lamp housing 150. The compliant conductors 154 transfer thermal energy from the lower window 104 to the lamp housing 150 via conduction, as opposed to convection or radiation that would otherwise occur in the absence of the compliant conductors 154. While some convective or radiating heat transfer may still occur even in the presence of the compliant conductors 154, the convective or radiating heat transfer is orders of magnitude smaller, and thus, generally negligible compared to the conductive heat transfer facilitated by the compliant conductors. In one example, the compliant conductors 154 are formed from copper and have a volume density of about 40 percent, and the gap 151 is filled with helium. In such an example, the transfer of heat due to the compliant conductors 154 is more than 100 times the transfer of heat due to convection or radiation. The relatively greater heat transfer of the compliant conductors 154 is at least partially due to the higher thermal conductivity of the compliant conductor 154 compared to the gas in the gap 151.

The compliant conductors 154 are formed from a compliant material and have substantially the same conduction length across the gap 151, regardless of the machining tolerances of the lower surface 104a of the lower window 104. The "zig-zag" or serpentine shape of the compliant conductors 154 allow the compliant conductors 154 to expand and contract to remain in contact with the lower window 104 and the lamp housing 150. As illustrated in FIG. 2, both of the compliant conductors 154 shown have the same overall conduction path, however, the compliant conductors 154 are shown in different states of expansion in order to contact both the lower window 104 and the lamp housing 150. The different states of expansion of the compliant conductors 154 are dictated by the lack of planarity of the lower surface 104a, since the compliant conductors 154, which are generally fixedly attached to the lamp housing 150, expand to contact the lower window 104. However, regardless of the expansion state of the compliant conductors 154, the conduction path length of the compliant conductors 154 remains constant. Thus, heat transfer from the lower window 104 to the lamp housing 150 is consistent across all locations of the gap 151 regardless of the varying dimensions of the gap 151. Moreover, the conduction path is consistent from chamber-to-chamber, irrespective of machining differences in chamber components of the individual chambers.

The compliant conductors 154 are formed from a material having a high thermal conductivity, including metals such as stainless steel, nickel, copper, iron, inconel, aluminum, or combinations thereof, and ceramics such as alumina, magnesia, aluminum nitride, zirconia, silica, and combinations thereof. The compliant conductors 154 also optionally include a coating 155 at least on a portion adjacent the lower surface 104a of the lower window 104. The coating 155 reduces undesired scratching or marring of the lower window 104 due to contact with the compliant conductors 154. The coating 155 may include glassy carbon, graphite, boron nitride, or mica. It is contemplated that the coating 155 may be omitted in some embodiments. In such an embodiment, a lubricant such as graphite, hexagonal boron nitride, or molybdenum disulfide may be applied to the lower window 104 or the compliant conductors 154 to reduce scratching or marring of the lower window 104. The compliant conductors 154 are generally fixedly attached to the lamp housing 150, for example, by brazing or welding. Bonding of compliant conductors 154 including ceramic may be accomplished using a bonding agent including sodium silicate, ammonia silicate, aluminum phosphate, zinc phosphate, or other nano-dispersed suspensions.

Figure 3:
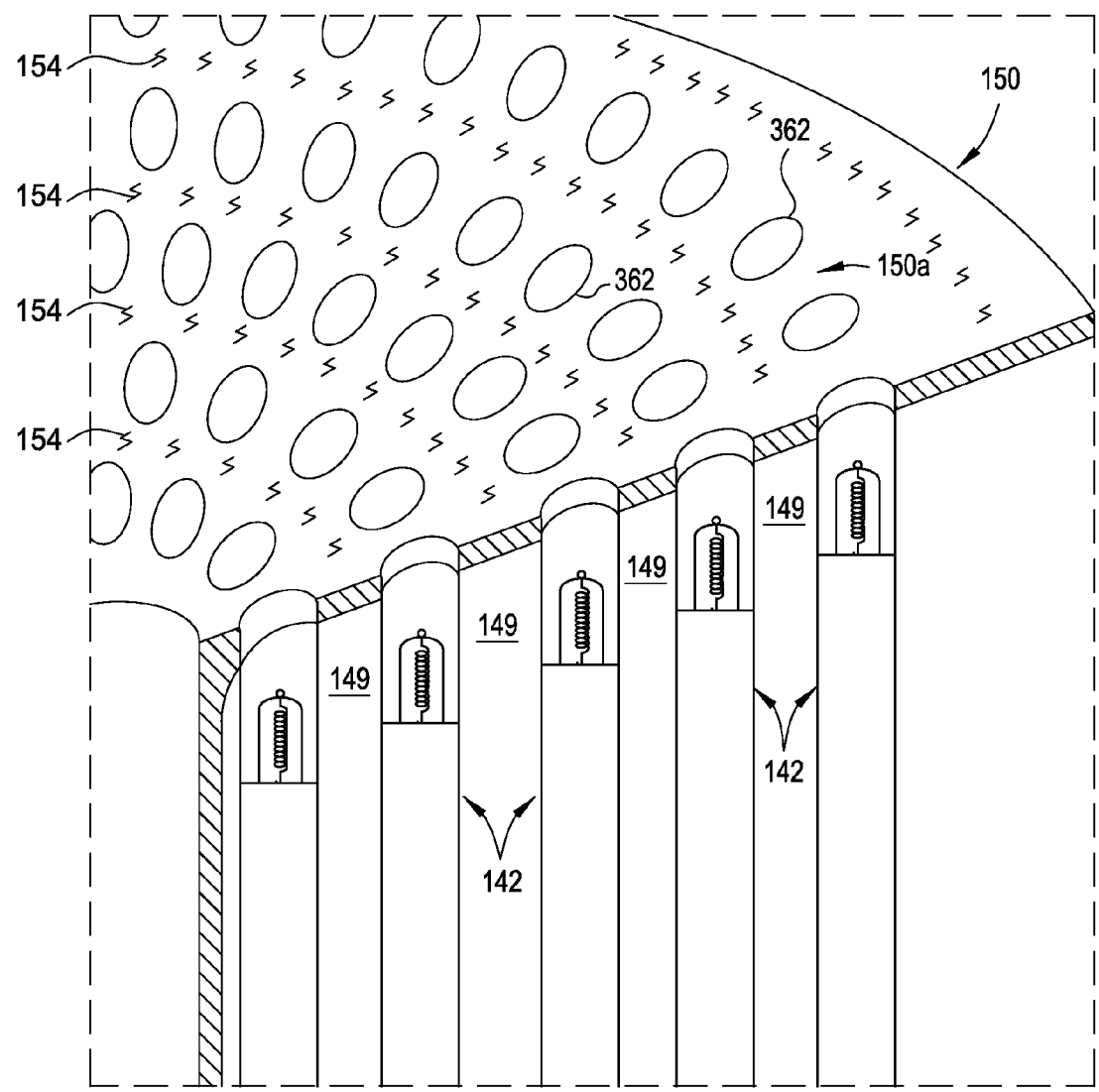
FIG. 3 is a partial sectional schematic view of a lamp housing, according to one embodiment of the disclosure.

FIG. 3 is a partial sectional schematic view of the lamp housing 150, according to one embodiment of the disclosure. The upper surface 150a includes features, such as openings 362, formed therein. The openings 362 allow radiant energy from the lamps 142 to pass through the upper surface 150a to impinge upon a substrate or substrate support. An opening 362 is disposed above each of the lamps 142. Between rows of the openings 362, compliant conductors 154 are coupled to the upper surface 150a. The compliant conductors 154 are positioned such that radiant energy from the lamps 142 is not blocked by the compliant conductors 154. The compliant conductors 154 are arranged in annular rows, however, additional distributions are also contemplated. In addition, it is contemplated that the spacing and density (compliant conductors 154 per area) can also be adjusted to facilitate a predetermined amount of heat transfer form a lower window to the lamp housing 150. In one example, the compliant conductors 154 may cover about 40 percent of the upper surface 150a. In another example, the compliant conductors may have a spacing of about 2 millimeters to about 3 millimeters.

Figure 4A:
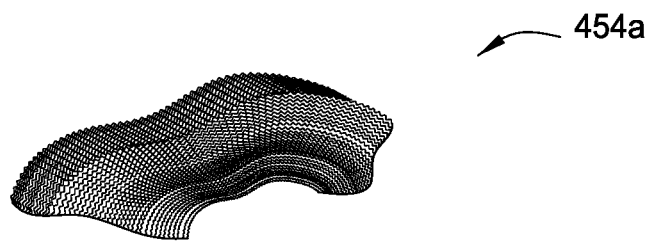
FIGS. 4A-4D illustrate compliant conductors according to other embodiments of the disclosure.

FIGS. 4A-4D illustrate compliant conductors according to other embodiments of the disclosure. FIG. 4A illustrates a compliant conductor 454a formed from a wool. The wool may include any of the metal or ceramic materials discussed above. The compliant conductor 454a may optionally include a coating thereon (not shown for clarity), such as coating 155 discussed with respect to FIG. 2, for reducing scratching of a lower window. The compliant conductor 454a may be coupled to a lamp housing in discrete patches or in strips.

Figure 4B:
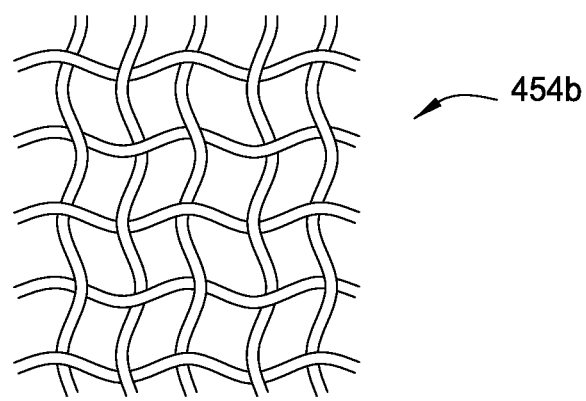

FIG. 4B illustrates a compliant conductor 454b. The compliant conductor 454b is a wire mesh. The wire mesh may include any of the metal or ceramic materials discussed above. The compliant conductor 454b may optionally include a coating thereon (not shown for clarity), such as coating 155 discussed with respect to FIG. 2, for reducing scratching of a lower window. The compliant conductor 454b may be coupled to a lamp housing in discrete patches or in strips.

Figure 4C:
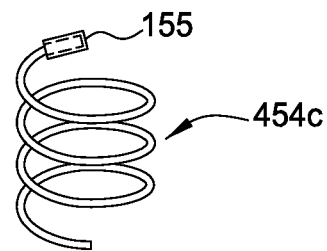
Figure 4D:
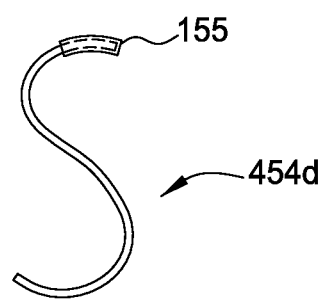

FIG. 4C illustrates a complaint conductor 454c. The compliant conductor 454c is formed in a helical shape, and may be, for example, a spring formed from a metal discussed above. A coating 155 is disposed on an end of the compliant conductor 454c adapted to contact a lower window. FIG. 4D illustrates a compliant conductor 454d having an "S" shape. The compliant conductor 454d also includes a coating 155 disposed on an end of the compliant conductor 454c adapted to contact a lower window.

FIGS. 4A-4D illustrate compliant conductors according to some embodiments of the disclosure, however, additional shapes for compliant conductors are also contemplated. Additional shapes also include metal chainmail or batting, bubbled metal foil, folded metal foil leaves, and connected metal foil tubes. In another embodiment, it is contemplated that the compliant conductors may be formed from any material sufficient to withstand a desired process temperature, such as about 300 degrees to about 400 degrees Celsius, or greater. In another embodiment, the coatings 155 may include siloxane polymers, polyimides, or polytetrafluoroethylene.

In another embodiment, it is contemplated that compliant conductors, such as compliant conductors 454a and 454b, may be impregnated or coated with one or more fluids or near-fluids, such as waxes, grease, and/or compliant polymers, to facilitate increased heat transfer. In such an embodiment, it is contemplated that the porosity and surface tension of the compliant conductors may facilitate restriction of the fluids or near-fluids into undesired regions of the processing chamber. One example of compliant polymers may include silicone rubber or filled silicones. A filled silicone, for example, may include particles of thermally conducting material, such as metallic flakes, to increase heat transfer. In one embodiment, silicon rubber may have a thermal conductivity of about 1.3 W/mΩk.

Benefits of embodiments described herein include uniform cooling of chamber components irrespective of machining tolerances of the chamber components. Thus, chamber-to-chamber temperature control is more uniform, resulting in more uniform properties of substrates processed in different chambers.

While the foregoing is directed to embodiments of the present disclosure, other and further embodiments of the disclosure may be devised without departing from the basic scope thereof, and the scope thereof is determined by the claims that follow.

What is claimed is:
1. A process chamber, comprising:
a chamber body including an optically transparent window;
a lamp housing disposed adjacent to the optically transparent window, the optically transparent window and the lamp housing having a gap therebetween and one or more cooling channels disposed within the lamp housing; and
a plurality of compliant conductors disposed within the gap between the lamp housing and transparent window and in contact with the lamp housing and transparent window.

2. The process chamber of claim 1, wherein each of the compliant conductors has a substantially equal length.

3. The process chamber of claim 1, wherein each of the compliant conductors includes a coating thereon.

4. The process chamber of claim 1, wherein the coating comprises glassy carbon, graphite, boron nitride, or mica.

5. The process chamber of claim 1, wherein the compliant conductors comprise a ceramic.

6. The process chamber of claim 5, wherein the ceramic comprises alumina, magnesia, aluminum nitride, zirconia, silica, or combinations thereof.

7. The process chamber of claim 1, wherein the compliant conductors comprise a metal.

8. The process chamber of claim 7, wherein the metal comprises stainless steel, nickel, copper, iron, inconel, aluminum, or combinations thereof.

9. The process chamber of claim 8, wherein the compliant conductors are brazed or welded to the lamp housing.

10. The process chamber of claim 1, wherein the compliant conductors are mesh or wool comprising metal or ceramic.

11. The process chamber of claim 1, wherein the compliant conductors have a serpentine shape.

12. The process chamber of claim 1, wherein the compliant conductors are shaped as a helical coil.

13. A process chamber, comprising:
a chamber body including an optically transparent window;
a lamp housing disposed adjacent to the optically transparent window, the optically transparent window and the lamp housing having a gap therebetween and one or more cooling channels disposed within the lamp housing; and
a plurality of compliant conductors disposed within the gap between the lamp housing and transparent window and in contact with the lamp housing and transparent window, the compliant conductors including mesh or wool.

14. The processing chamber of claim 13, wherein the mesh or wool is impregnated with a material to increase heat transfer.

15. The processing chamber of claim 14, wherein the impregnating material includes a wax, grease, or compliant polymer.

16. The processing chamber of claim 15, wherein the impregnating material is silicone.

17. The processing chamber of claim 16, wherein the silicone includes particles embedded therein.

18. The processing chamber of claim 17, wherein the particles include metallic flakes.

19. The processing chamber of claim 18, wherein the mesh or wool comprises a metal or a ceramic.

20. A process chamber, comprising:
a chamber body including an optically transparent window;
a lamp housing disposed adjacent to the optically transparent window, the optically transparent window and the lamp housing having a gap therebetween and one or more cooling channels disposed within the lamp housing; and a plurality of compliant conductors disposed within the gap between the lamp housing and transparent window and in contact with the lamp housing and transparent window, wherein the compliant conductors include a coating on an end thereof in contact with the transparent window.

* * * * *